(12) United States Patent
Ishikawa et al.

(10) Patent No.: US 6,278,139 B1
(45) Date of Patent: Aug. 21, 2001

(54) SEMICONDUCTOR LIGHT-EMITTING DIODE

(75) Inventors: Takuya Ishikawa; Satoshi Arakawa; Toshikazu Mukaihara; Akihiko Kasukawa, all of Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/402,757
(22) PCT Filed: Feb. 15, 1999
(86) PCT No.: PCT/JP99/00628
 § 371 Date: Jun. 9, 2000
 § 102(e) Date: Jun. 9, 2000
(87) PCT Pub. No.: WO99/41789
 PCT Pub. Date: Aug. 19, 1999

(30) Foreign Application Priority Data

Feb. 13, 1998 (JP) .................................................. 10-030721

(51) Int. Cl.[7] ........................ H01L 33/00; H01L 31/256
(52) U.S. Cl. ................................. 257/103; 257/99; 257/96
(58) Field of Search ............................... 257/103, 96, 97, 257/99

(56) References Cited

U.S. PATENT DOCUMENTS 6,107,647 * 8/2000 Matsumoto et al. .
6,127,691 * 10/2000 Fukunaga et al. .
6,147,364 * 11/2000 Itaya et al. .
6,169,296 * 1/2001 Kamiyama et al. .

FOREIGN PATENT DOCUMENTS

| 04100277A | 4/1992 | (JP) . |
| 07174567A | 6/1992 | (JP) . |
| 06151955A | 5/1994 | (JP) . |
| 06326352A | 11/1994 | (JP) . |
| 08111544A | 4/1996 | (JP) . |
| 08204234A | 8/1996 | (JP) . |

* cited by examiner

Primary Examiner—Stephen D. Meier
(74) Attorney, Agent, or Firm—Helfgott & Karas, P.C.

(57) ABSTRACT

A semiconductor light emitting diode (10) is formed on an n-type GaAs substrate and includes: an AlGaInP based double heterojunction structure in which an active layer (16) is sandwiched between cladding layers (14, 18); an upper P-type contact layer 20; and a ring-shaped upper electrode (22) having an opening (28), wherein light is emitted through the upper p-type contact layer (20) and the opening (28) of the upper electrode (22). The upper p-type contact layer (20) is a semiconductor layer made of AlGaAs or AlGaAsP having an Al content of 0.5 or more, and doped with impurities at a carrier concentration of $5 \times 10^{18}$ cm$^{-3}$ or more. The semiconductor light emitting diode emits light in a desired emission pattern and at higher intensities, and is capable of being fabricated by relatively simple processes.

4 Claims, 7 Drawing Sheets

EMISSION PATTERN (a)

(b)

EMISSION PATTERN (a)

(b)

EMISSION PATTERN (a)

(b)

EMISSION PATTERN (a)

(b)

BLANK IN EMISSION PATTERN

EMISSION PATTERN

EMISSION PATTERN

SEMICONDUCTOR LIGHT-EMITTING DIODE

FIELD OF THE INVENTION

The present invention relates to a semiconductor light emitting diode fabricated on an n-type GaAs substrate for emitting visible light and, more particularly, to a high-intensity semiconductor visible light emitting diode having a double hetero-junction structure made of AlGaInP based materials.

BACKGROUND

With remarkable developments of information processing technologies, semiconductor light emitting devices have increasingly large demands as light sources for optical communications, optical recording media, and image displays. In particular, visible light emitting diodes (hereinafter, a light emitting diode will be abbreviated to LED) of higher intensities are strongly required for development thereof as effective light sources for image displays.

AlGaInP based mixed-crystal semiconductor lattice matched with a GaAs substrate, as it is capable of forming excellent hetero-junctions and suited to obtain high luminance LEDs, is widely used in recent years as a material for forming high luminance LEDs which can display visible colors from red to green.

To obtain high luminance LEDs, it is necessary to generate light from a prescribed limited region thereof. Basically, conventional AlGaInP based LEDs, despite of their various systems for guiding the light from the prescribed limited region, were classified roughly into only two types based on the shapes of contact layers thereof.

One example is an LED having a contact layer of the shape as shown in FIG. 5. FIG. 5(a) is a schematic sectional view showing the layered structure of a conventional AlGaInP based LED, and FIG. 5(b) is a diagram showing the emission pattern of the conventional LED shown in FIG. 5(a).

The conventional LED 50 shown in FIG. 5 includes, on an n-type GaAs substrate 52, a double hetero-junction structure composed of an n-AlGaInP lower cladding layer 54, an active layer 56, and a p-AlGaInP upper cladding layer 58 which are consecutively layered. The LED 50 also has: a p-GaAs contact layer 60 formed on the double hetero-junction structure so as to have the same diameter as an upper electrode, and to be concentrically thereto; the upper electrode 64 formed on the contact layer 60 and having a circular central opening 62 as a light emitting region; and an n-side electrode 66 formed on the bottom surface of the GaAs substrate 52.

The other example is an LED 70 having a contact layer of the shape as shown in FIG. 6. FIG. 6(a) is a schematic sectional view showing the layered structure of the another conventional AlGaInP based LED, and FIG. 6(b) is a diagram showing the emission pattern of the conventional LED shown in FIG. 6(a).

The conventional LED 70 shown in FIG. 6 has a structure similar to that of the LED 50 shown in FIG. 5, except that a current diffusion layer 72 made of p-AlGaAs and a p-GaAs contact layer 74 having a shape similar to that of the upper electrode 64 are formed on the double heterojunction structure.

In the LED 50 of FIG. 5 having the circular light emitting region 62, the contact layer 60 made of GaAs is usually formed in order to provide lattice matching with the AlGaInP based double heterojunction structure being in lattice match with GaAs, followed by etching thereof to form a circular contact layer, and by providing thereon the ring-shaped upper electrode 64 having the circular opening as the light emitting region, to thereby obtain the circular emission pattern.

GaAs, however, has a high absorbance with respect to the emission wavelength; therefore, in the LED 50, the contact layer has a large absorbance for radiated light, resulting in a large factor of decreasing the radiation from the LED.

Meanwhile, the LED 70 shown in FIG. 6 and having the contact layer of a ring shape similar to that of the upper electrode is a conventional example which avoids the aforementioned decrease in brightness resulting from the absorption by the GaAs contact layer. Here, the high-absorptive GaAs contact layer 74 is formed at the limited area directly below the ring-shaped upper electrode 64; besides, the current diffusion layer 72 is arranged below the contact layer 74 for sufficient diffusion of the injected current.

This, while reducing the absorption of emitted light in the contact layer to obtain emission of higher intensities, leads to the drawbacks in that: the injected current diffuses beyond the upper electrode to result in a poor emission efficiency; and, as shown in FIG. 6(b), a doughnut-shaped emission pattern occurs having a blank at the center, which is not acceptable as a circular emission pattern.

Thus, as an LED for preventing the absorption in the GaAs contact layer and having an emission pattern of approximately circular shape, there is a proposal for an LED 80 having the configuration as shown in FIG. 7 in which the current diffusion layer outside the electrode is etched for removal. FIG. 7 is a schematic sectional view showing the layered structure of yet another conventional LED. This LED 80 has a configuration similar to that of the LED 70 shown in FIG. 6, except that a p-type current diffusion layer 82 made of AlGaAs is formed as a circular layer which has the same outer diameter as those of the upper electrode 64 and the contact layer 74 and is concentric thereto.

While the LED 80 shown in FIG. 7, due to suppression of the light emission outside the upper electrode, is improved in emission efficiency as compared with the LED shown in FIG. 6, it has a drawback in that its emission pattern tends to take a doughnut shape and is difficult to form in an acceptable circular shape. Besides, a step is needed for deeply etching the current diffusion layer, which yielded the drawbacks of increasing the steps in fabricating the elements and of the complicated processes.

As described above, the conventional AlGaInP based LEDs have various problems, and it is difficult, by relatively simple processes, to fabricate an LED for emitting light in a desired emission pattern and at higher intensities.

SUMMARY OF THE INVENTION

An object of the present invention is to provide a semiconductor light emitting diode which emits light in a desired emission pattern and at higher intensities, and has a configuration capable of being fabricated by relatively simple processes.

The present inventors conceived that: since AlGaAs or AlGaAsP having an Al content of 0.5 or more has a larger bandgap as compared with GaAs, a contact layer formed from AlGaAs or AlGaAsP makes a contact layer approximately transparent to the light emitted by an AlGaInP based active layer to allow a large reduction of the light absorption in the contact layer; and the contact layer is doped with impurities of the same conductivity type at a higher concentration to elevate the carrier concentration so that the current diffusion in the contact layer is enhanced to eliminate the need for the current diffusion layer provided in the conventional art. The present inventors had repeated experiments along the concept for the accomplishment of the present invention.

In order to achieve the foregoing objects, on the basis of the knowledge thus obtained, the present invention provides a semiconductor light emitting diode formed on an n-type GaAs substrate and includes an AlGaInP based double heterojunction structure having an active layer sandwiched between cladding layers, and a p-side electrode having an opening and arranged on the double heterojunction structure with an intervention of a p-type contact layer, characterized in that:

the p-type contact layer is formed as a semiconductor layer made of AlGaAs or AlGaAsP having an Al content of 0.5 or more and doped with p-type impurities at a carrier concentration of $5 \times 10^{18} cm^{-3}$ or more; and light is emitted through the p-type contact layer and the opening in the p-side electrode.

According to the present invention, since the upper p-type contact layer of the semiconductor light emitting diode formed on the n-type GaAs substrate is formed as a semiconductor layer which is made of AlGaAs or AlGaAsP having a specified Al content and doped with impurities to have the specified carrier concentration, the light absorption in the contact layer is reduced to achieve a visible semiconductor laser which emits light at a high luminance in a desired emission pattern and is capable of fabrication by relatively simple processes.

In the present invention, while there is no limitation on the epitaxial method for the AlGaInP based semiconductor, a metal-organic chemical vapor deposition (MOCVD) is usually employed in most cases. By the way, it is extremely difficult to dope AlGaAs or AlGaAsP having a large Al content with Zn, which is the most typical p-type dopant used in the MOCVD method, to a concentration as high as $5 \times 10^{18} cm^{-3}$ or more. Thus, in the present invention, carbon (C) dopant is preferably adopted as the p-type impurities to allow an impurity concentration of $5 \times 10^{18} cm^{-3}$ or more.

The high-concentration doping for higher carrier concentrations adequately enhances the current diffusion in the contact layer, which makes the current diffusion layer needed in conventional LEDs unnecessary. Therefore, a semiconductor light emitting diode which emits light at a high luminance in a desired emission pattern can be fabricated by relatively simple fabrication processes which eliminate the need for the step of forming a current diffusion layer.

In a further preferred embodiment of the present invention, a low-reflective coating film composed of dielectric substance is formed on the p-type contact layer within the opening of the p-side electrode. Furthermore, in another preferred embodiment, the semiconductor light emitting diode according to the present invention comprises: a low-reflective coating film composed of dielectric substance formed on the p-type contact layer within the opening of the p-side electrode; and a reflective mirror composed of a semiconductor multilayered film arranged between the double heterojunction structure and the n-type GaAs substrate.

The provision of a low-reflective film on the p-type contact layer, and the provision of a reflective mirror composed of a semiconductor multilayered film between the substrate and the double heterojunction structure as well, enables a higher-efficiency in light generation in the active layer, achieving a semiconductor light emitting diode of yet higher intensities.

DESCRIPTION OF THE PREFERRED EMBODIMENTS

Hereinafter, embodiments of the present invention will be described more specifically and in more detail, by enumerating the embodiments with reference to the accompanying drawings.

First Embodiment

Figure 1:
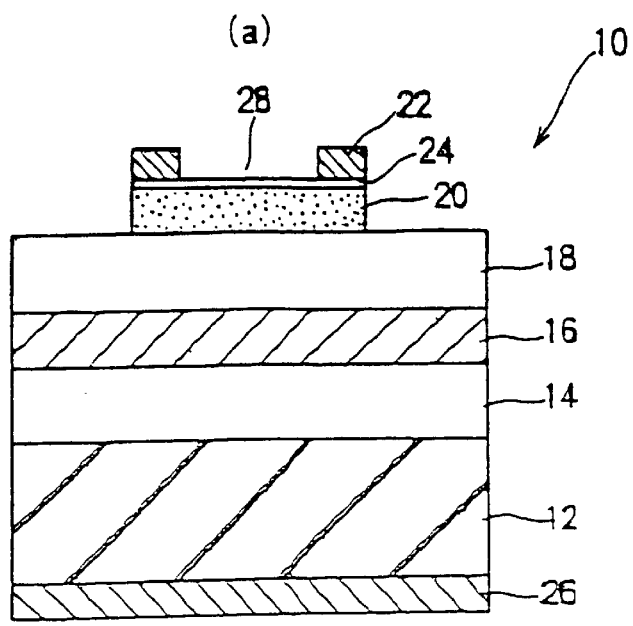
FIG. 1(*a*) is a schematic sectional view showing the ayered structure of an LED of the first embodiment, and FIG. 1(*b*) is a diagram showing the emission pattern of the LED of the first embodiment.
Figure 1:
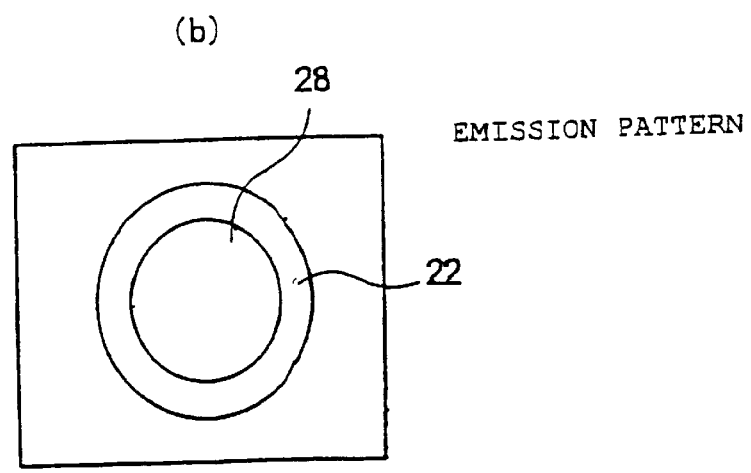

The present embodiment is an example of the embodiment of a semiconductor light emitting diode according to the present invention. FIG. 1(*a*) is a schematic sectional view showing the layered structure of the semiconductor light emitting diode of the present embodiment, and FIG. 1(*b*) is a diagram showing the emission pattern of the semiconductor light emitting diode of the present embodiment.

The semiconductor light emitting diode (hereinafter, referred to simply as LED) 10 of the present embodiment includes, as shown in FIG. 1(*a*), an n-type GaAs substrate 12, a double heterojunction structure formed on the GaAs substrate 12, a circular p-type contact layer 20 formed on the double heterojunction structure so as to have the same outer diameter as a p-side electrode 22 and to be in a circular shape concentric thereto, the p-side electrode 22, a protective layer 24 made of GaAs and arranged between the contact 20 and the p-side electrode 22, and an n-side electrode 26 provided on the bottom surface of the GaAs substrate 12.

The double heterojunction structure is composed of an n-AlGaInP lower cladding layer 14, an GaInP active layer 16, and a p-AlGaInP upper cladding layer 18.

In the present embodiment, the contact layer 20 is implemented by an AlGaAs layer having an Al content of 0.9 and being doped with carbon at a carrier concentration as extremely high as $3 \times 10^{19} cm^{-3}$. As shown in FIG. 1(*a*), the p-side electrode 22 is a ring-shaped electrode having a central circular opening 28 as a light emitting region 28. In order to prevent the oxidization of the contact layer 20, the protective layer 24 is formed between the contact layer 20 and the p-side electrode 22.

To fabricate the LED 10 of the present embodiment, the lower cladding layer 14, the active layer 16, and the upper cladding layer 18 are epitaxially grown on the n-GaAs substrate 12 in sequence by a MOCVD method. The growth conditions include a temperature of 670° C. and a V/III ratio of 250 in the reacting gas.

Then, on the upper cladding layer 18 is epitaxially grown the contact layer 20 by a MOCVD method at a temperature of 500° C. and a V/III ratio of 10. The use of these conditions provides the doping with carbon at the carrier concentration as extremely high as $3 \times 10^{19} cm^{-3}$. Furthermore, on the contact layer 20 is epitaxially grown the protective layer 24 by a MOCVD method under the conditions of 670° C. temperature and a 250 V/III ratio.

Then, the protective layer 24 and the contact layer 20 are etched to have a prescribed shape by a photolithographic and chemical etching technique.

Subsequently, an electrode pattern is formed by photolithography, followed by deposition of metal thereon to form the p-side electrode 22. Moreover, the substrate 12 is polished to a prescribed thickness, and then metal is deposited to form the n-side electrode 24, thereby completing the LED 10.

Second Embodiment

Figure 2:
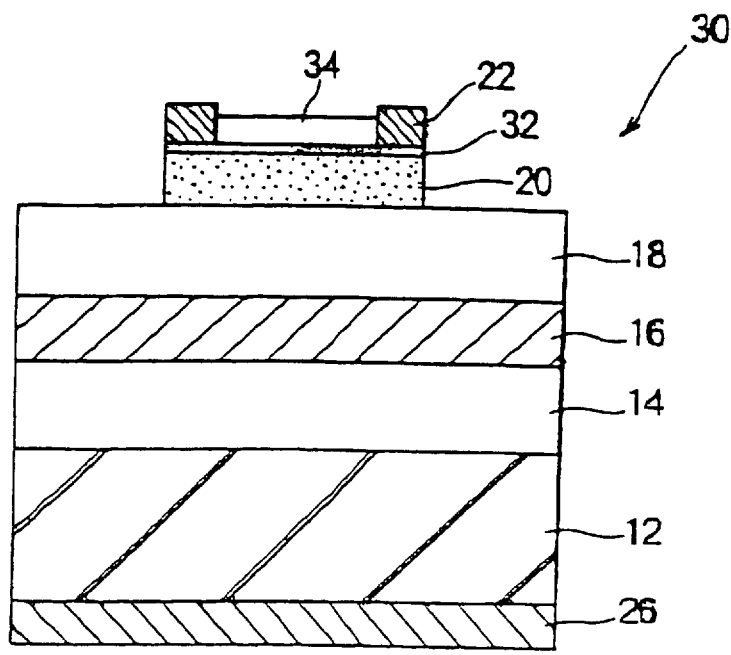
FIG. 2(*a*) is a schematic sectional view showing the layered structure of an LED of the second embodiment, and FIG. 2(*b*) is a diagram showing the emission pattern of the LED of the second embodiment.
Figure 2:
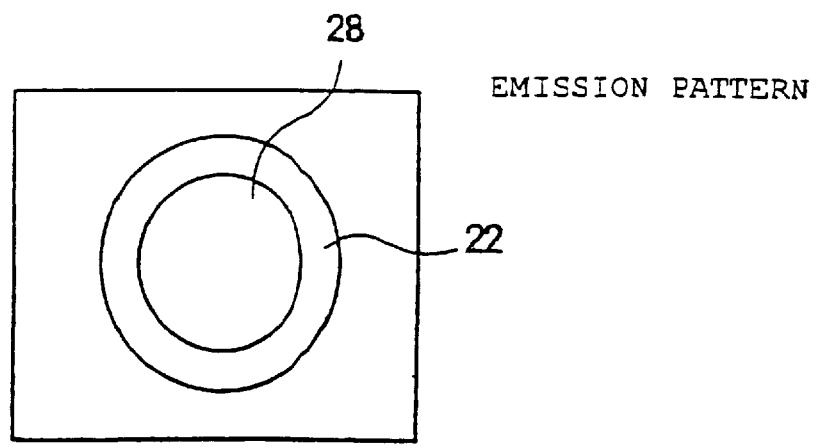

The present embodiment is another example of the embodiment of the LED according to the present invention. FIG. 2(a) is a schematic sectional view showing the layered structure of the LED of the present embodiment, and FIG. 2(b) is a diagram showing the emission pattern of the LED of the present embodiment.

The LED 30 of the present embodiment has a structure similar to that of the first embodiment, and includes: a substrate 12; a double heterojunction structure formed on the substrate 12 and including a lower cladding layer 14, an active layer 16 and an upper cladding layer 18; and a contact layer 20 formed on the double heterojunction structure.

The LED 30 further includes: a GaAs protective layer 32 having a shape similar to that of the contact layer 20; a p-side electrode 22 and an n-side electrode 26 both similar to those of the first embodiment; and an SiN reflective film 34 having a low reflective index and formed by coating so as to fill the opening in the p-side electrode 22. The SiN reflective film 34 has a film thickness of approximately 100 nm so that the optical path length thereof is a fourth the emission wavelength.

To fabricate the LED 30 of the present embodiment, the double heterojunction structure is formed on the substrate 12, followed by filming of the contact layer 20 and the GaAs protective layer 32, under filming conditions similar to those of the first embodiment.

Thereafter, by a photolithographic and chemical etching technique, the protective layer 32 and the contact layer 20 are etched for patterning to have a prescribed circular shape.

Subsequently, the SiN dielectric film 34 is deposited to an approximately 100-nm-thickness. Furthermore, a portion of the SiN dielectric film 34 formed within the area-to-be of the p-side electrode 22 is removed by a photolithographic and etching technique to expose the protective layer 32.

Subsequently, an electrode pattern is formed by photolithography, followed by deposition of metal thereon to form the p-side electrode 22. Moreover, the substrate 12 is polished to a prescribed thickness, and then metal is deposited to form the n-side electrode 26, thereby completing the LED 30.

Third Embodiment

Figure 3:
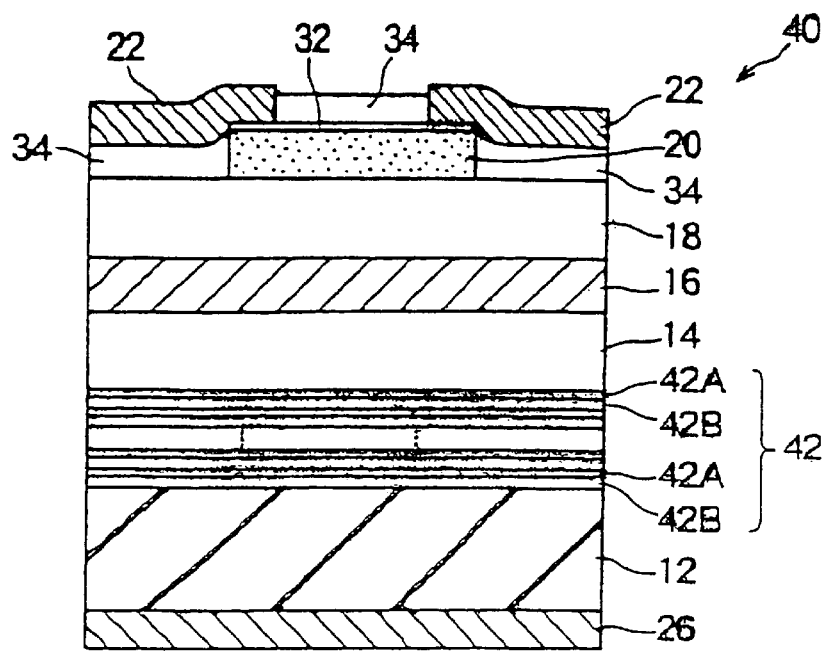
FIG. 3(*a*) is a schematic sectional view showing the layered structure of an LED of the third embodiment, and FIG. 3(*b*) is a diagram showing the emission pattern of the LED of the third embodiment.
Figure 3:
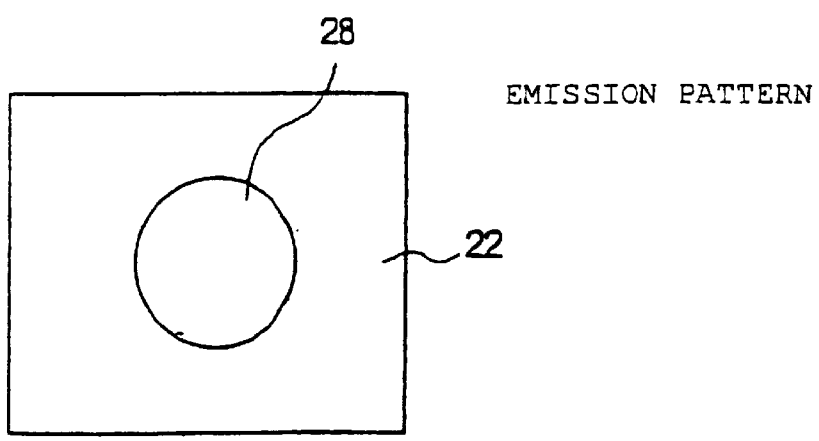

The present embodiment is yet another example of the embodiment of the LED according to the present invention. FIG. 3(a) is a schematic sectional view showing the layered structure of the LED of the present embodiment, and FIG. 3(b) is a diagram showing the emission pattern of the LED of the present embodiment.

The LED 40 of the present embodiment has a structure similar to that of the first embodiment except that a multiple reflection mirror 42 implemented by a multi-layered film is provided between a substrate 12 and a lower cladding layer 14. More specifically, the LED 40 includes: the substrate 12; the double heterojunction structure formed on the substrate 12 and including the lower cladding layer 14, an active layer 16, and an upper cladding layer 18; and a contact layer 20 formed on the double heterojunction structure.

The LED 40, similarly to the structure of the second embodiment, includes a protective layer 32, a low-reflectivity SiN reflective film 34, and a p-side electrode 22, as well as an n-side electrode 26.

The multiple reflection mirror 42 arranged between the substrate 12 and the lower cladding layer 14 is a reflection mirror having a multi-layered structure obtained by iteratively forming 10 cycles of pair of layers including 40-nm-thick n-$(Al_{0.1}Ga_{0.9})InP$ 42A and 60-nmn-thick n-$(Al_{0.9}Ga_{0.1})InP$ 42B by using a MOCVD method.

It is to be noted that the multiple reflection mirror 42 is not limited to the materials used in the present embodiment, and may adopt other combinations such as $Al_{0.5}Ga_{0.5}As/AlAs$ films or $Al_{0.5}Ga_{0.5}As/Al_{0.5}In_{0.5}P$ films.

To fabricate the LED 40 of the present embodiment, the multiple reflection mirror 42 is formed on the substrate 12 by iteratively forming 10 cycles of pair of layers including 40-nm-thick n-$(Al_{0.1}Ga_{0.9})InP$ 42A and 60-nm-thick n-$(Al_{0.9}Ga_{0.1})InP$ 42B, by the MOCVD method under the film-forming conditions of a 670° C. temperature and a 250 V/III ratio.

Subsequently, as in the second embodiment, the double heterojunction structure is formed on the substrate 12, followed by forming the contact layer 20, the GaAs protective layer 32, the SiN dielectric film 34, and the p- and n-side electrodes 22, 26.

EXPERIMENTAL EXAMPLE

To evaluate the LEDs 10, 30, 40 of the first through third embodiments in emission property thereof, the emission patterns were examined. All of the emission patterns of the LEDs 10, 30, 40 exhibited a sharp-edged circular pattern, as shown in FIGS. 1(b), 2(b), 3(b), respectively.

Figure 4:
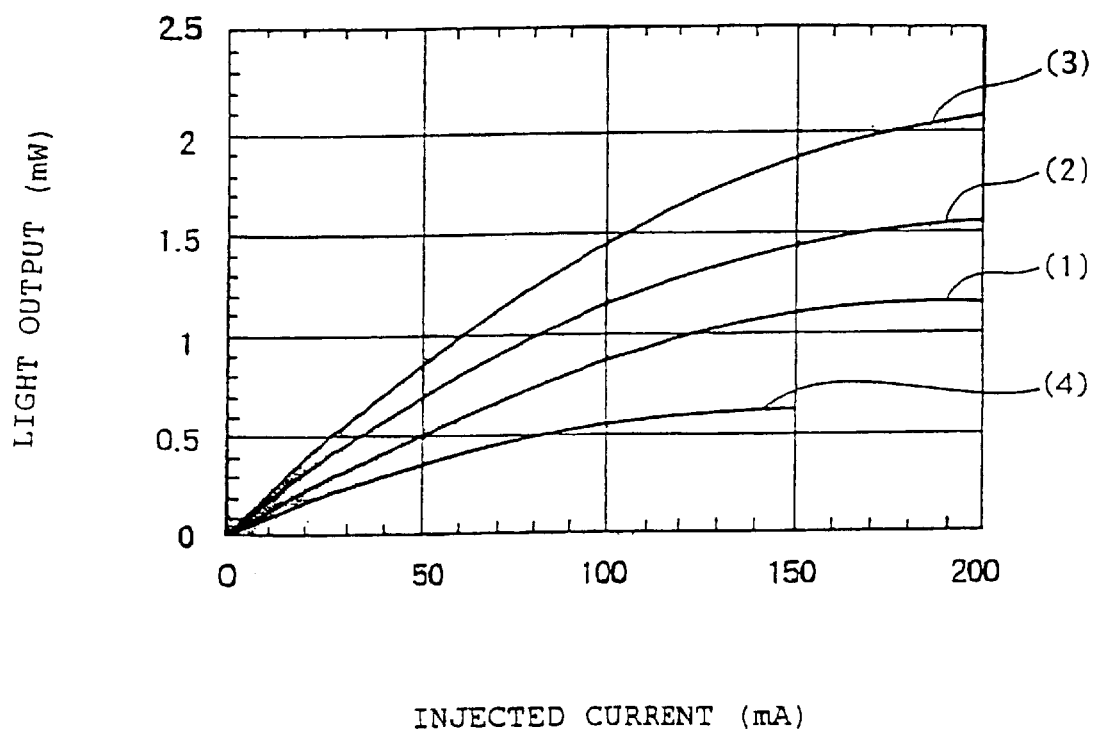
FIG. 4 is a graph illustrating the relationship between the injected current and the light output power.
Figure 5:
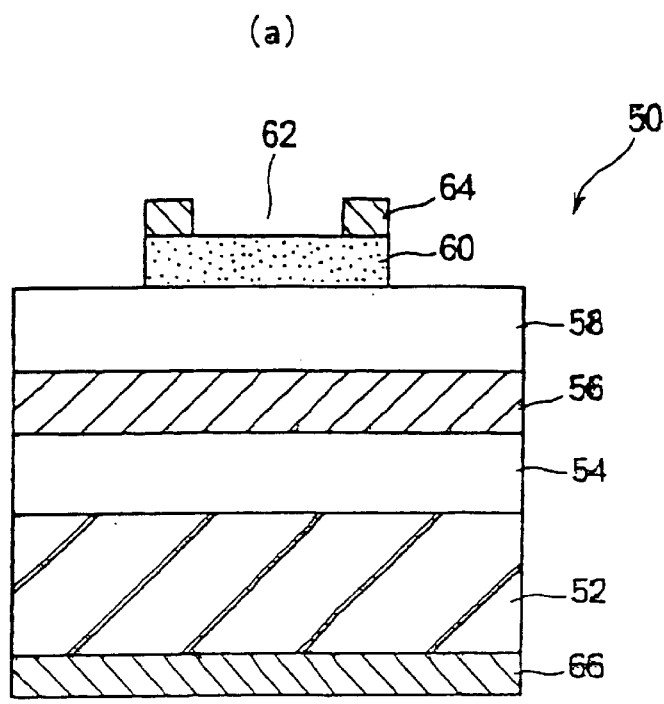
FIG. 5(*a*) is a schematic sectional view showing the layered structure of a conventional LED, and FIG. 5(*b*) is a diagram showing the emission pattern of the conventional LED shown in FIG. 5(*a*).
Figure 5:
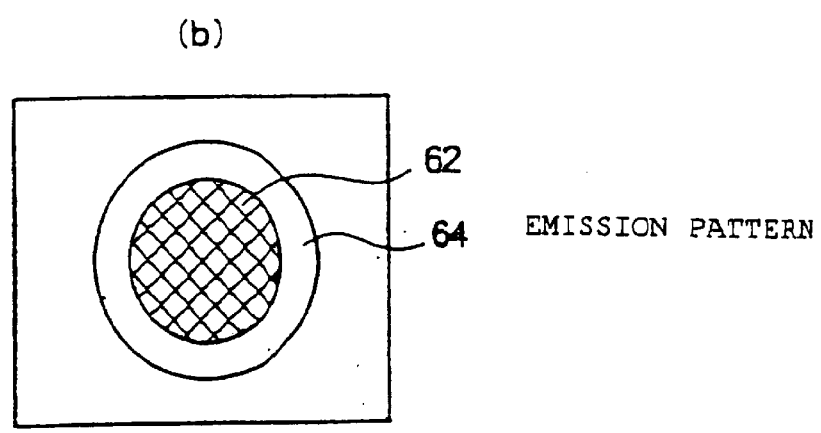
Figure 6:
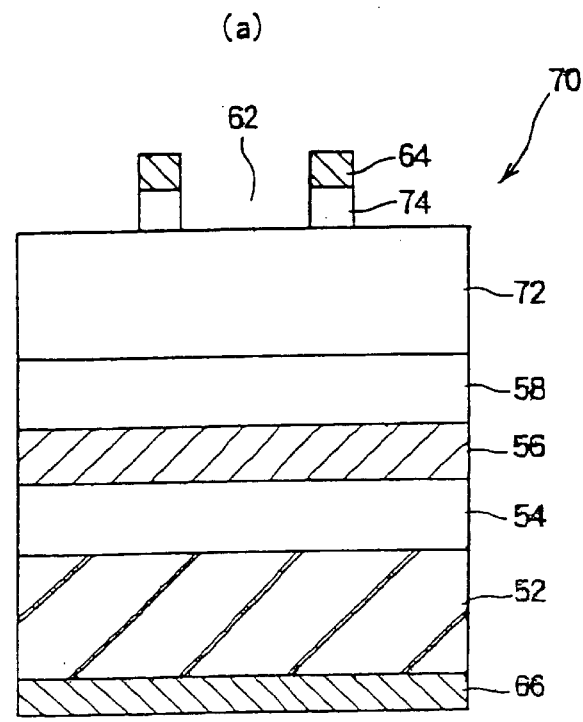
FIG. 6(*a*) is a schematic sectional view showing the layered structure of another conventional LED, and FIG. 6(*b*) is a diagram showing the emission pattern of the another conventional LED shown in FIG. 6(*a*).
Figure 6:
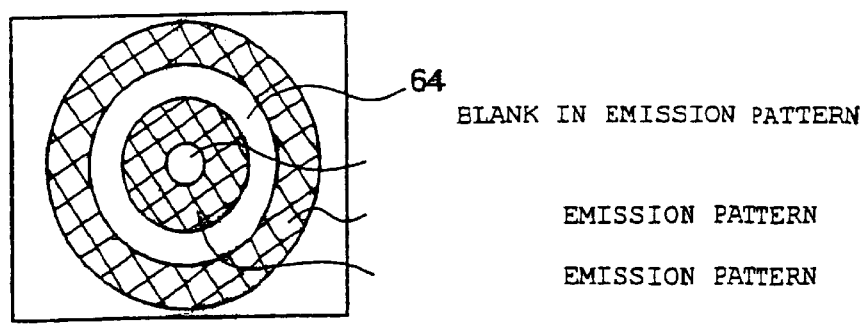
Figure 7:
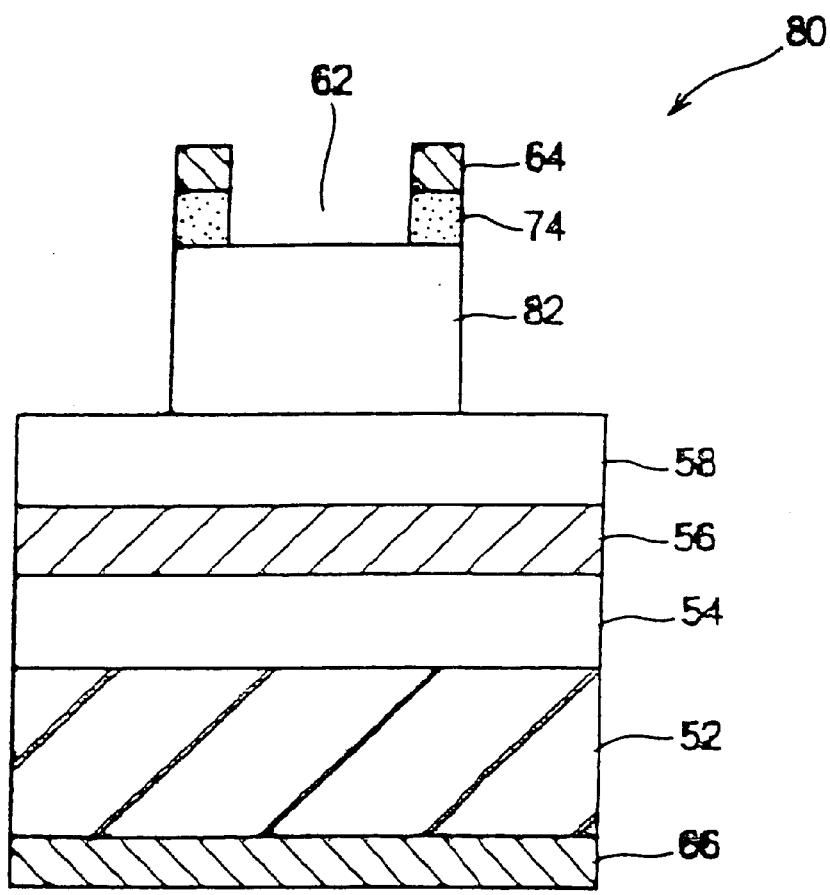
FIG. 7 is a schematic sectional view showing the layered structure of yet another conventional LED.

Moreover, the LEDs 10, 30, 40 were measured for the relationship between the light output power and magnitude of the current injected between the electrodes, and the conventional LED 80 shown in FIG. 7 was also measured for the same relationship for the purpose of comparison, thereby obtaining the measurements shown in FIG. 4. As shown in FIG. 4, all of the LEDs of the first through third embodiments exhibited a higher light output power at the same magnitude of the injected current compared with the conventional LED. The LED 40 of the third embodiment provided with the reflecting mechanism had an especially excellent emission property of higher intensities. In FIG. 4, the graphs (1), (2), and (3) represent the properties of the first through third embodiments, respectively; and the graph (4) represents the property of the conventional LED.

As apparently seen from the above-described experimental example, it is possible to evaluate that the LED of the present embodiment is a LED for emitting visible light which can be fabricated by relatively simple processes with little increase in the number of steps as compared with the conventional method, and which emits light at higher intensities and with a desired circular emission pattern.

Moreover, although the description of the first through third embodiments exemplifies an active layer of bulk structure, the present invention can be preferably applied to an LED having an active layer of quantum well structure to provide a similar result.

What is claimed is:

1. A semiconductor light emitting diode, formed on an n-type GaAs substrate, comprising an AlGaInP based double heterojunction structure having an active layer sandwiched between cladding layers, and a p-side electrode having an opening and formed on said double heterojunction structure with an intervention of a p-type contact layer, characterized in that:

said p-type contact layer is formed as a semiconductor layer made of AlGaAs or AlGaAsP having an Al content of 0.5 or more and doped with p-type impurities at a carrier concentration of $5 \times 10^{18}$ cm$^{-3}$ or more; and light is emitted through said p-type contact layer and the opening of said p-side electrode.

2. The semiconductor light emitting diode as defined in claim 1, characterized in that carbon (C) is used for said p-type impurities doped into said AlGaAs or AlGaAsP layer which forms said p-type contact layer.

3. The semiconductor light emitting diode as defined in claim 1 or 2, characterized in that a low-reflectivity coating film made of a dielectric material is formed on said p-type contact layer within the opening of said p-side electrode.

4. The semiconductor light emitting diode as defined in claim 1 or 2, characterized by:

a low-reflectivity coating film made of a dielectric material and formed on said p-type contact layer within the opening of said p-side electrode; and a reflection mirror made of a semiconductor multi-layered film and arranged between said double heterojunction structure and said n-type GaAs substrate.

* * * * *